United States Patent
Graeupner

(10) Patent No.: US 8,027,091 B2
(45) Date of Patent: Sep. 27, 2011

(54) METHOD FOR CORRECTING OPTICAL PROXIMITY EFFECTS

(75) Inventor: Paul Graeupner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 719 days.

(21) Appl. No.: 11/750,547

(22) Filed: May 18, 2007

(65) Prior Publication Data

US 2008/0032207 A1 Feb. 7, 2008

(30) Foreign Application Priority Data

May 18, 2006 (DE) .......................... 10 2006 024 114

(51) Int. Cl.
*G02B 5/18* (2006.01)
(52) U.S. Cl. ........................................ 359/569; 359/558
(58) Field of Classification Search .................. 359/558, 359/569; 355/53, 71
See application file for complete search history.

(56) References Cited

U.S. PATENT DOCUMENTS

| | | | |
|---|---|---|---|
| 5,144,362 A | 9/1992 | Kamon et al. | |
| 5,316,896 A | 5/1994 | Fukuda et al. | |
| 5,323,208 A | 6/1994 | Fukuda et al. | |
| 5,448,336 A | 9/1995 | Shiraishi | |
| 5,595,857 A | 1/1997 | Fukuda et al. | |
| 5,610,684 A | 3/1997 | Shiraishi | |
| 5,638,211 A | 6/1997 | Shiraishi | |
| 5,701,014 A | 12/1997 | Berger et al. | |
| 5,715,039 A | 2/1998 | Fukuda et al. | |
| 6,417,974 B1 | 7/2002 | Schuster | |
| 6,700,649 B2 | 3/2004 | Chandhok et al. | |
| 2005/0018312 A1 | 1/2005 | Gruner et al. | |
| 2005/0146704 A1 | 7/2005 | Gruner et al. | |
| 2006/0077371 A1 | 4/2006 | Wegmann et al. | |

(Continued)

FOREIGN PATENT DOCUMENTS

DE    102 18 989 A1    6/2003

(Continued)

OTHER PUBLICATIONS

Fukuda, H, et al., "Can synthetic aperture techniques be applied to optical lithography?" Journal of Vac. Sci. Technol. B, vol. 14, No. 6, Nov./Dec. 1996, American Vacuum Society, pp. 4162-4166.

(Continued)

*Primary Examiner* — Joshua L Pritchett
(74) *Attorney, Agent, or Firm* — Sughrue Mion, PLLC

(57) ABSTRACT

In a method for correcting optical proximity effects (Optical Proximity Correction, OPC) when imaging a pattern, arranged in the object surface of a projection objective, into the image surface of the projection objective with the aid of a projection objective, a multiplicity of optical elements and at least one pupil surface that is Fourier-transformed to the image surface are arranged between the object surface and the image surface. An optical filtering of the light used for the imaging is carried out with the aid of at least one OPC filter inserted between the object surface and the image surface in accordance with an OPC filter function that is adapted to the pattern and corresponds to a spatially dependent transmission filtering in the region of the pupil surface of the imaging system. The profile of the pupil transmission function is adapted with the aid of the OPC filter to the pattern, characterized by the position of diffraction orders, of the mask such that there is respectively present for all the diffraction orders contributing to the imaging an optimized pupil transmission which leads to a minimization of line width variations, dependent on line density, in the image surface.

37 Claims, 4 Drawing Sheets

U.S. PATENT DOCUMENTS

| | | |
|---|---|---|
| 2006/0268251 A1 | 11/2006 | Deguenther et al. |
| 2007/0024837 A1 | 2/2007 | Fiolka |

FOREIGN PATENT DOCUMENTS

| | | |
|---|---|---|
| EP | 0 485 062 A2 | 5/1992 |
| EP | 0 638 847 B1 | 2/1995 |
| EP | 1 063 551 A1 | 12/2000 |
| JP | 09068790 A | 3/1997 |
| JP | 2001085315 A | 3/2001 |
| WO | WO 2005/015310 A2 | 2/2005 |
| WO | WO 2005/069078 A1 | 7/2005 |
| WO | WO 2007/009543 A1 | 1/2007 |
| WO | WO 2007/051574 A1 | 5/2007 |

OTHER PUBLICATIONS

Erdelyi, M., et al., "Enhanced optical microlithography with a Fabry-Perot-based spatial filtering technique.", Applied Optics vol. 39, No. 7, Mar. 2000, Optical Society of America, pp. 1121-1129.

METHOD FOR CORRECTING OPTICAL PROXIMITY EFFECTS

This application claims the benefit of German Patent Application No. DE 10 2006 024 114.2 filed on May 18, 2006. The disclosure of this patent application is incorporated herein in its entirety by reference.

BACKGROUND OF THE INVENTION

1. Field of the Invention

The invention relates to a method for correcting optical proximity effects (Optical Proximity Correction, OPC) when imaging a pattern, arranged in the object surface of a projection objective, into the image surface of the projection objective. The invention further relates to an optical filter, a method for producing an optical filter, and to a projection objective that is assigned at least one optical filter.

2. Description of Related Art

Projection objectives for microlithography are used in projection exposure machines for fabricating semiconductor components and other finely structured devices. These optical imaging systems serve for imaging patterns of photomasks or lined plates, which are arranged in the object surface of the projection objective and are generally referred to as masks or reticles, onto an article, arranged in the image surface of the projection objective and coated with a light-sensitive layer, with very high resolution on a demagnifying scale. When fabricating semiconductor components, the pattern is formed as a rule by lines and other structural units of a specific layer of the semiconductor component to be produced. The structures to be produced for the semiconductor components can include tiny metallic tracks and silicon tracks as well as other structural elements whose critical dimensions (CDs) can be substantially smaller than the wavelength of the ultraviolet light used for the imaging, and can, for example, be of orders of magnitude of 100 nm or thereunder.

Specific problems arise from the small size of the structures to be imaged, and from the finite size and other limiting factors of the projection system. For example, the high-frequency components of the light used for the imaging which are required for the imaging of sharp corners are partly incapable of passing through the projection objective, and therefore cannot contribute to the imaging. Moreover, scattered light which is produced at a structural unit is capable to a certain extent of influencing the imaging of a closely neighbouring structure, and this leads to a complex interaction of the electric fields for closely neighbouring structures. These effects are referred to as "Optical Proximity Effects". In the case of the structures produced, these effects can cause the structures produced to deviate in a typical way from the associated shapes of the structures on the mask. These effects include, in particular, undesired line width variations as a function of the spatial density of neighbouring lines, as a result of which the signal processing speed of the semiconductor component can be impaired, and a shortening of the line ends (line-end shortening), it therefore being possible to lose a desired contact between abutting structural elements.

One contribution to diminishing these problems is the correction of optical proximity effects (optical Proximity Correction, OPC). "Optical Proximity Correction" usually refers to a method with the aid of which the shapes of the structural elements on the mask are modified in targeted fashion in order to compensate the described nonideal properties of the lithography process. In this case, a desired shape is prescribed for the structural elements to be attained on the article to be structured, and the corresponding structural elements on the mask are modified in order to improve the reproduction of the critical geometries. In order to compensate the shortened line ends (line-end shortening), the corresponding line end of the mask structure is widened into a hammerhead shape. In order to compensate the rounding of corners, serifs are added to or subtracted from the corresponding corners of the mask structure in order to produce in the structured article corners whose configuration is closer to the desired, ideal corner shape. The task of conventional "Optical Proximity Correction" is therefore essentially to find in the case of a prescribed, desired geometrical structure of the article to be structured a mask design which leads to an actual structure which is as close as possible to the desired ideal structure while taking account of all the influences of the lithography process which vary structures.

Owing to the fact that the process windows in the microlithography fabrication of finely structured devices are becoming ever smaller, it is becoming increasingly more difficult and expensive to calculate and to fabricate mask structures which ensure a desired structure on the structured article. Consequently, the conventional methods of optical proximity correction are also becoming ever more complicated. In addition, small modifications to the process parameters of a lithography process can have the effect that the mask for a desired structure must be changed although the geometry of the desired structure does not change. This causes the lithography process to become more expensive and less stable overall.

U.S. Pat. No. 5,701,014 describes a method and a device for projection lithography in which the contrast produced in a radiation-sensitive coating material by optical proximity effects is removed in a single projection exposure step. A filter with two openings is inserted for this purpose in the region of a field plane of the projection system. One of the openings serves as opening for the passage of the radiation which is desired for the imaging and produces the desired structure in the radiation-sensitive material. A fraction of an inverse radiation passes through the other opening onto the radiation-sensitive material and thereby removes the contrast produced by optical proximity effects.

SUMMARY OF THE INVENTION

It is an object of the invention to provide a method for correcting optical proximity effects with the aid of which it is possible to diminish the outlay and costs in adapting lithography methods to changed process conditions. It is another object to provide corresponding projection objectives.

To address these and other objects, the invention, according to one formulation, provides a method for correcting optical proximity effects (Optical Proximity Correction, OPC) when imaging a pattern, arranged in the object surface of a projection objective, into the image surface of the projection objective with the aid of a projection objective, wherein a multiplicity of optical elements and at least one pupil surface that is Fourier-transformed to the image surface are arranged between the object surface and the image surface, having the following step:

optical filtering of the light used for the imaging with the aid of at least one OPC filter inserted between the object surface and the image surface in accordance with an OPC filter function that is adapted to the pattern and corresponds to a spatially dependent transmission filtering in the region of the pupil surface of the imaging system, wherein the OPC-filter function is selected in conjunction with consideration of the position of diffraction orders caused by the pattern of the mask in such a way that a variation in the line widths in the image surface that are generated by interference of diffraction orders is substantially weaker than in the case of the same projection objective without OPC filtering.

In accordance with one aspect of the invention, a method is provided for correcting optical proximity effects (optical Proximity Correction, OPC) when imaging a pattern, arranged in the object surface of a projection objective, into the image surface of the projection objective with the aid of a projection objective, in the case of the projection objective a multiplicity of optical elements and at least one pupil surface that is Fourier-transformed to the image surface being arranged between the object surface and the image surface. The method comprises optical filtering of the light used for the imaging with the aid of at least one OPC filter inserted between the object surface and the image surface in accordance with an OPC filter function that is adapted to the pattern and corresponds to a spatially dependent transmission filtering in the region of the pupil surface of the imaging system. Spatially resolving transmission filtering in the vicinity of the pupil surface, and/or angle-selective transmission filtering in the region of a field surface are/is used in conjunction with consideration of the position of diffraction orders caused by the pattern of the mask so that owing to the OPC filtering variation in the line widths in the image surface of the projection objective (or in the exposed substrate) that are generated by interference of diffraction orders is substantially weaker than in the case of the same projection objective without OPC filtering.

This aspect of the invention is based, inter alia, on the consideration that differently structured partial patterns of a pattern respectively have different diffraction properties that can be expressed, for example, in different spectra of the diffraction angles and/or different directions of the diffraction effect and/or different scattering effects. In this way, different partial patterns "see" different regions of the pupil surface as a function of their different structural properties. If OPC filtering that corresponds to a spatially dependent transmission filtering in the region of the pupil surface is now carried out, it is possible to set respectively for differently structured partial patterns an accurately adapted transmission, generally differing for each partial pattern, of the projection objective. The transmission distribution is selected such that it is possible at least partially to attain a correction of optical proximity effects (Optical Proximity Correction). This pattern-specific OPC filtering is effective independently of field, that is to say independently of the positions of the partial patterns on the mask to be imaged.

It is preferred to arrange in the region of the pupil surface an OPC filter in which the transmission varies as a function of the pupil spatial coordinate. Alternatively or in addition, angle-selective filtering is possible in the region of a field surface that is Fourier-transformed to the pupil surface. A method for optical filtering that is suitable for this purpose is described in DE 102 18 989 A1 from the applicant, the disclosure content of which is to this extent incorporated in this description by reference.

If use is made of a mask whose pattern is formed by different partial patterns, it is possible by means of a pattern-specific transmission function of the OPC filter to achieve that the projection objective maintains different and respectively adapted transmission properties for different partial patterns of the mask (for example, partial patterns with different line densities or periodicities) such that a pattern-specific dose variation effectively takes place during the exposure. It is thereby possible, for example, for a first partial pattern having a first line density to be imaged with a first dose during a single exposure, while a second partial pattern having a second line density, deviating from the first line density, is simultaneously imaged with a second dose that differs from the first dose. The first and the second doses can respectively be set with the aid of the OPC filtering in a fashion largely independent of one another such that both the first and the second partial pattern are imaged under respectively optimally adapted imaging conditions, at least with regard to the intensity of the radiation contributing to the imaging.

As a rule, the different partial patterns lie next to one another or laterally offset from one another with or without a spacing. It is also possible, alternatively or in addition, that partial patterns overlap and/or penetrate one another at least in some regions.

The pattern-specific dose variation can, in particular, be optimized such that spatially resolving transmission filtering in the vicinity of the pupil surface, and/or angle-selective transmission filtering in the region of a field surface are/is used in conjunction with consideration of the position of diffraction orders caused by the pattern of the mask so that owing to the OPC filtering variation in the line widths in the image surface of the projection objective or in the exposed substrate that are generated by interference of diffraction orders is substantially weaker than in the case of the same projection objective without OPC filtering.

In some embodiments, the OPC filter function is set such that for different grating constants P of periodic partial patterns of the mask a variation $\Delta LW'$ in the line widths in the image surface of the projection objective is smaller over all the grating constants occurring in the mask than a limit value $L(\Delta LW')$ or corresponds to this limit value. The tolerances expressed by the limit value are product-dependent. In the case, for example, of logic circuits, where importance attaches chiefly to the data transmission rate, the limit value can be less than 1.5%. The integration density is decisive in the case of bulk storage devices (for example DRAM); here, the tolerances are generally higher, for example less than 5%. It therefore preferably holds that: $L(\Delta LW') \leq P \cdot 0.05$. The absolute values of the different grating constants can differ from one another at least by the factor 2, for example, the differences also frequently being greater such that the greatest grating constant is, for example, at least 2 times or at least 6 times or at least 8 times as great as the smallest grating constant. Typical grating constants are strongly dependent on the product; they can, for example, lie in the range between 60 nm and 2000 nm, in particular in the range between 80 nm and 1000 nm.

By way of example, it is possible under these conditions to image periodic structures of the 80 nm node, that is to say structures with a half pitch of 80 nm, or with a grating constant P=160 nm with line width variations $\Delta LW'$ of 4.8 nm or less. It would be possible correspondingly to attain line width variations with $\Delta LW' \leq 3.9$ nm for structures of the 65 nm node, etc. With the aid of these slight variations in the critical dimensions of periodic line structures, it is possible, in particular, to optimize the production of LSI memory chips, for example of dynamic random access memories (DRAMs), with regard to reliability, storage density and/or access speed. It is also possible to improve the production of different sorts of integrated circuits.

The OPC filter function respectively optimal for the imaging of specific patterns with the aid of specific projection objectives can be determined experimentally, for example by respectively using different filters when imaging a pattern, and evaluating the substrates respectively exposed with regard to the line width variations $\Delta LW'$ attained. In one method variant, the suitable OPC filter function is determined by means of reverse engineering. Such a method for producing an optical filter for carrying out an optical filtering in accordance with a filter function has the following steps:
defining a pattern that has a first partial pattern with a first line density, and at least a second partial pattern with a second line density, which differs from the first line density;
calculating an imaging of the pattern, arranged in the object surface of a projection objective, into the image surface of the projection objective with the aid of a projection objective, wherein a multiplicity of optical elements and at least one pupil surface that is Fourier-transformed to the image surface are arranged between the object surface and the image surface;
defining a filter function for optically filtering the light used for the imaging, the filter function corresponding to a spatially dependent transmission filtering in the region of the pupil surface of the projection objective;
determining a variation in line widths in the image surface of the projection objective that are generated by interference of diffraction orders of the pattern;
optimizing the filter function by stepwise variation in the filter function and repeated determination of the variation in the line width in order to determine an optimized filter function (OPC filter function) in which the variation in the line widths that are generated lies below a prescribed limit value; and
producing the optical filter in accordance with the optimized filter function.

Via an iterative process, the "answer" of the imaging process can be optimized, with regard to the line widths generated (CD response), with the aid of such a method, in which, for example, suitable model functions are varied (for example polynomials with reference to a variable x for lines defined in the y-direction). Optical filters that are produced with the aid of this method therefore have an OPC filter function that is adapted both to the diffraction properties of specific masks and to the imaging properties of the corresponding projection objective such that the pattern-specific line width variations in the image surface of the projection objective or in the exposed substrate lie below a threshold regarded as critical.

The invention also relates to an optical filter (OPC filter) that can be or has been produced with the aid of such a method or is particularly adapted for OPC filtering in another way.

Although the OPC-filter may be designed as an angularly selective filter, the OPC-filter is preferably designed as an transmission filter adapted to be inserted into a region of a pupil surface of the projection objective, where the transmission of the transmission filter varies as a function of the pupil spatial coordinate.

In some applications it may be advantageous if the OPC-filter has the non-rotational symmetric transmission. For example, the transmission function can have a two-fold radial symmetry with respect to an optical axis such that the transmission function is essentially invariant only upon rotation of the transmission filter by 180° or an integer multiple thereof. For example, the transmission filter may have an elliptic transmission function. Other multiple radial symmetries are also possible, for example a four-fold radial symmetry.

In some embodiments the OPC-filter has a transmission having at least one intermediate value between completely transparent and completely opaque. At the same time, completely transparent or completely opaque regions may be present. The transmission filter may be designed as a grayfilter having a plurality of at least three different transmission values in a filter effective area. The transmission may vary in steps depending on the spatial coordinate in some embodiments the transmission varies continuously with the location on the transmission filter at least in a partial area of the transmission filter. Particularly, the transmission may vary continuously in at least one direction transverse to the radiation direction. Providing a continuous variation of the transmission in the manner of a continuous filter the transmission may be adjusted in a spatially varying manner across the OPC-filter without steps, whereby a precise adjustment to the local transmission desired for a respective pupil coordinate is possible.

In some applications the transmission filter is adapted to a pattern having lines, wherein a fraction of the lines or all lines are oriented parallel to each other in a first direction perpendicular to the optical axis of the projection system, wherein the transmission filter has a transmission that is maximum in a central region to be placed on the optical axis, the transmission of the transmission filter is substantially constant over all pupil coordinates in a first direction of the transmission filter to be aligned parallel to the first direction of the mask, and a transmission varying over the cross section of the transmission filter is present in a second direction to be aligned perpendicular to the lines to be imaged.

For example, the transmission may decrease from the central region towards the edges of the transmission filter in steps or continuously. In some embodiments decrease of transmission in the second direction is symmetrical to the central region, such that the transmission function of the transmission filter has a two-fold radial symmetry relative to the center of the central region. The variation in the second direction may be asymmetric in other embodiments.

The amount of variation of the transmission may vary. A transmission difference between a maximum and a minimum transmission may for example be more than 5% or more than 10% or more than 15% of the maximum transmission. The minimum transmission may be more than 50% of the maximum transmission, e.g. more than 60% or more than 70% or more than 75% of the maximum transmission. In those cases the overall light loss may be relatively small, while at the same time significant corrections of the transmission function are possible.

In many applications masks are used where the pattern has a first partial pattern having a first line density at the second partial pattern having a second line density line differing from the first line density. As a consequence, partial patterns with different structures are lying laterally offset next to each other or interposed with each other.

Such patterns having periodic line structures with different line densities may for example be used in the manufacture of dynamic semiconductor memories with random access (DRAM). For example, in those cases the filter function may be selected such that for different grating constants P of periodic partial patterns of the mask a variation $\Delta LW'$ in the line widths in the image surface of the projection objective is smaller for all the grating constants occurring in the pattern than a prescribable limit value $L(\Delta LW')$, or corresponds to this limit value such that the condition $L(\Delta LW') \leq P \cdot 0.05$ is satisfied. As a consequence, a variation of the created line widths in the exposed substrate may be substantially smaller than in an exposure where no such OPC-filter is used.

OPC-filters of the kind described above may be used for a fine tuning of the pupil transmission of projection objectives. Particularly it may be achieved by adjusting the pupil transmission to the pattern provided by the mask (e.g. reticle) that undesired line width variations, which may occur depending on the spatial density of neighbouring lines in a pattern or a partial pattern, are reduced below a critical threshold.

Therefore, by using one or more OPC-filters it is possible to adjust to one another a first projection objective and a second projection objective, which is different from the first projection objective with respect to at least one optical imaging property in regard to the at least one optical imaging property such that the first projection objective and the second projection objective have essentially the same imaging properties for the particular pattern, to which the filter function of the OPC-filter is adapted. This adaptation may be achieved by adjusting essentially the same pupil transmission for the first projection objective and the second projection objective with the aid of the at least one OPC-filter in dependence from the pattern.

According to a further aspect it is made possible, with the aid of the at least one OPC-filter, to use a second projection objective in connection with a reticle having a pattern, which is adapted to a first projection objective having other optical imaging properties than the second projection objective. Therefore, one aspect of the invention relates to the use of a second projection objective in connection with a reticle having a pattern adapted to a first projection objective having other imaging properties than the second projection objective, wherein imaging properties of the first and the second projection objective are adapted to each other for the particular pattern using an OPC-filter such as described above or below.

The invention also relates to the method of imaging a pattern arranged in the object surface of a projection objective into the image surface of the projection objective using a projection objective, wherein a multiplicity of optical elements and at least one pupil surface that is Fourier-transformed image surface are arranged between the object surface and the image surface, wherein the optical elements of the projection objective are not adapted to imaging the pattern, wherein the projection objective is adapted to the pattern by optical filtering the light used for the imaging with the aid of at least one OPC-filter inserted between the object surface and the image surface according to an OPC-filter function adapted to the pattern such that the pattern can be imaged into the image surface with the aid of the projection objective containing the OPC-filter. Preferably, the OPC-filter is a transmission filter having a spatially varying transmission, where the transmission filter is inserted into the beam path in the region of the pupil surface.

Apart from following from the claims, these and further features also follow from the description and the drawings, it being possible for the individual features respectively to be embodied on their own or multiply in the form of subcombinations in an embodiment of the invention and in other fields, and to constitute advantageous designs that are patentable per se. Exemplary embodiments of the invention are illustrated in the drawings and explained in more detail below.

DETAILED DESCRIPTION OF THE PREFERRED EMBODIMENTS

Figure 1A:
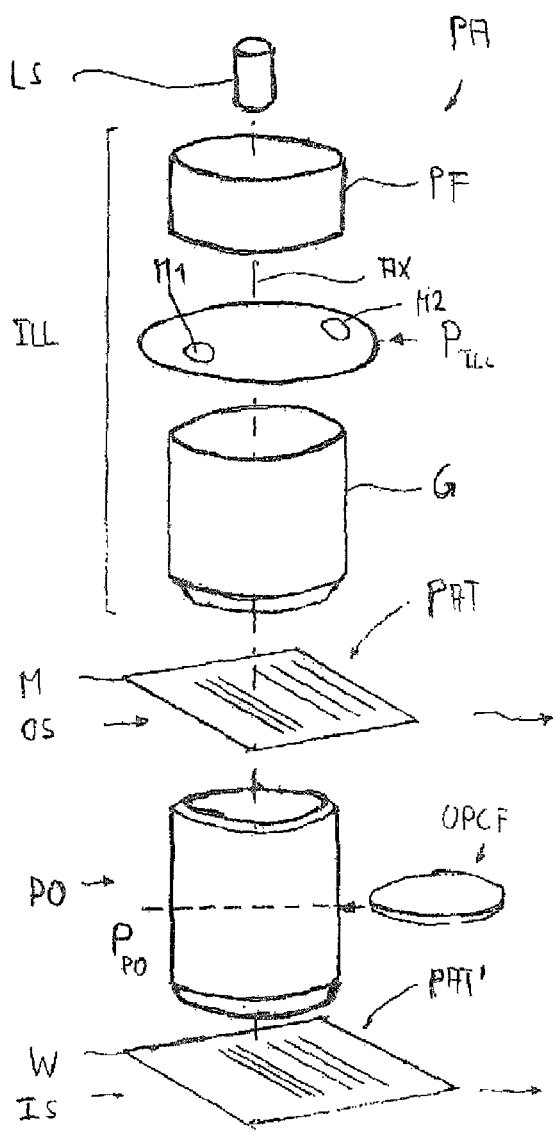
FIGS. 1a-1c show, in FIG. 1a, a schematic illustration of a microlithography projection exposure machine, as well as, in FIG. 1b, line patterns of a mask to be imaged and, in FIG. 1c, corresponding line patterns after imaging onto a semiconductor wafer.
Figure 1B:
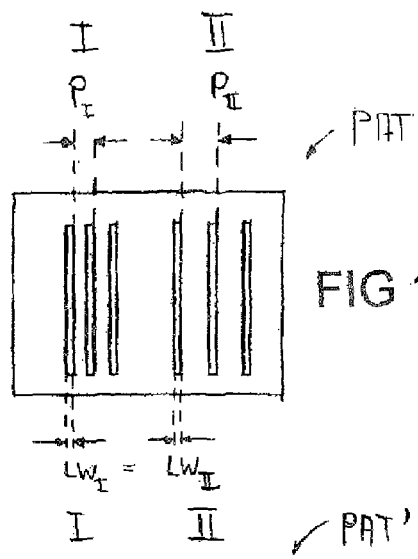
Figure 1C:
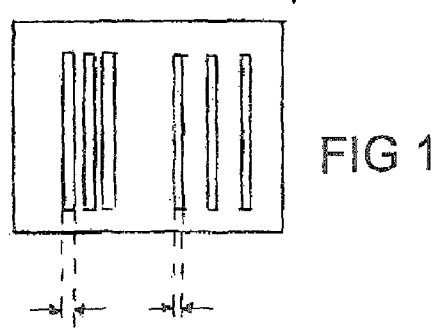

Shown diagrammatically in FIG. 1 is a microlithography projection exposure machine PA which can be used in the fabrication of semiconductor components and other finely structured devices and operates to attain resolutions down to fractions of micrometers with the aid of light from the vacuum ultraviolet (VUV) region or the deep ultraviolet (DUV) region. The projection exposure machine serves for exposing a radiation-sensitive substrate w which is arranged in the region of an image surface IS of a projection objective PO and has at least one image of a pattern of a mask M, which pattern is arranged in the region of an object surface OS of the projection objective PO. It includes an illuminating system ILL for receiving light from a primary light source LS and for illuminating the pattern of the mask M with illuminating radiation, and the projection objective PO, arranged between the mask M and the substrate W, for imaging the pattern PAT, arranged in its object surface, into its image surface IS, which is optically conjugate to the object surface OS.

The illuminating system ILL has a pupil shaping unit PF which is constructed from a number of optical elements and serves the purpose of setting a defined, spatial illumination level distribution, the so-called "illumination pupil", in a pupil surface $P_{ILL}$ of the illuminating system. The pupil surface $P_{ILL}$ lies at or near a position which is optically conjugate to possible downstream pupil surfaces of the illuminating system, as well as to the image-side pupil surface $P_{PO}$ of the projection objective PO such that the spatial light distribution in the pupil $P_{PO}$ of the projection objective is determined by the spatial light distribution (spatial distribution) in the pupil surface of the illuminating system. The pupil surface of the illuminating system lies, moreover, in a plane that is Fourier-transformed to the object surface OS of the projection objective, or in a surface of the illuminating system that is optically conjugate, or equivalent, to such a Fourier-transformed plane. The angular distribution of the illuminating radiation falling onto the mask M is thus determined by the illumination level distribution in the pupil shaping surface $P_{ILL}$. The illumination level distribution in the pupil surface $P_{ILL}$ is transformed with the aid of a group G of optical elements into the illuminating radiation directed onto the mask.

The design principle of the illuminating system can correspond, for example, to the assemblies of the illuminating systems shown in US 2005/0146704. Other designs are also possible. The projection objective can be of refractive, or refractive/reflective (catadioptric) or purely reflective (catoptric) design.

In the simplified exemplary case, the pattern PAT of the mask has two regions I and II lying next to one another and having different partial patterns. Each of the partial patterns consists of parallel lines of identical line width $LW_I=LW_{II}$, although the periodicity length $P_I$ in the region I is smaller than the periodicity length $P_{II}$ in the region II. The periodicity length is also denoted here as grating constant or pitch P.

In the case of an ideal imaging of the pattern PAT into the image surface IS of the projection objective in order to produce the reduced image PAT' of the pattern, the line widths of all the lines would also be identical after the imaging, and the absolute values LW' of the line widths in the image surface or in the exposed substrate would essentially be reduced in accordance with the reducing reduction ratio of the projection objective, for example 4:1 or 5:1. However, in conventional projection systems the abovementioned circumstances can give rise to the so-called optical proximity effects, which also include, in particular, undesired line width variations (CD variations) as a function of the spatial density (or the pitch) of neighbouring lines. This effect is shown diagramatically in FIG. 1c, which shows the image of the pattern PAT, shown in FIG. 1b, after imaging without compensation of optical proximity effects. It is to be seen that in the case of the partial pattern I with the higher line density (that is to say with the smaller periodicity length) on the exposed substrate a larger line width $LW_I'$ results than in the case of the lines of region II which lie further apart from one another. Depending on the illumination setting and other factors, the ratios can also be reversed such that partial patterns with higher line densities yield smaller line widths LW' on the exposed substrate.

Figure 2:
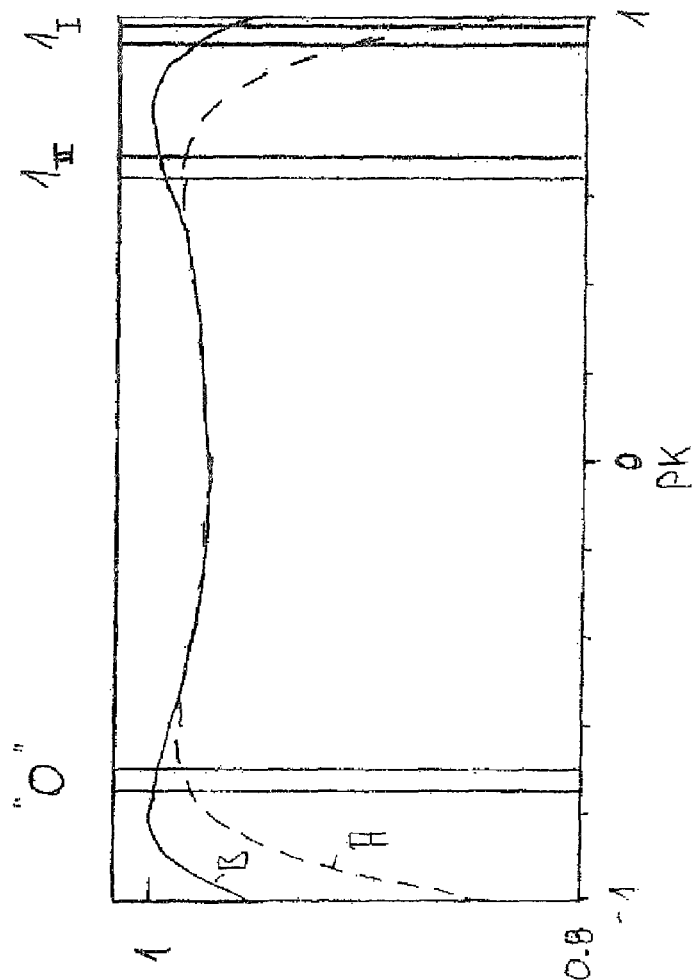
FIG. 2 shows a diagrammatic longitudinal section through a projection objective having an OPC filter in the vicinity of the pupil surface of the projection objective.

Some causes of this effect will now be explained in more detail with the aid of FIGS. 2 and 3. FIG. 2 shows a longitudinal section through an embodiment of a refractive projection objective PO in which only a few, representative lenses of the projection objective are shown. The imaging, produced by the projection objective, of an object field OF, arranged in the object surface OS, into an image field IP lying in the image surface IS is represented by two beams of which one (bundle B1) emanates from an object point lying on the optical axis AX, and the other (bundle B2) emanates from an off-axis object point furthest removed from the optical axis. The ray CR, emanating essentially perpendicular to the object surface OS in this projection objective, which is telecentric on the object side and image side, on the off-axis bundle B2 is the chief ray (principal ray) of the image, whose point of intersection with the optical axis fixes the axial position of the pupil surface $P_{PO}$ of the projection objective. In the vicinity of the pupil surface, an aperture stop AS is provided for limiting the beam cross section in the region of the pupil, and for fixing the numerical aperture NA used on the image side. The rays going from the object points to the edge of the aperture stop in each case are known here as "aperture rays" or "edge rays".

It is to be seen that the various rays (in conjunction, essentially, with an equal optical path length) cover different geometrical paths and strike the optical surfaces at strongly varying incidence angles. Near-axis rays which run along the optical axis or on the overall length very close to the optical axis experience a greater absorption inside the optical dense lens material than rays which run predominantly at the edge of the lenses. Conversely, it is precisely in the case of edge rays that particularly large incidence angles occur on the optical surfaces, as a result of which higher reflection losses arise, as a rule, for these rays than for rays running in the vicinity of the optical axis which penetrate the optical surfaces at least approximately perpendicular. It is therefore to be seen, in particular, that different rays emanating from one and the same object point "see" a different overall transmission on their path through the projection objective. This effect is referred to here as "apodization".

Figure 3:
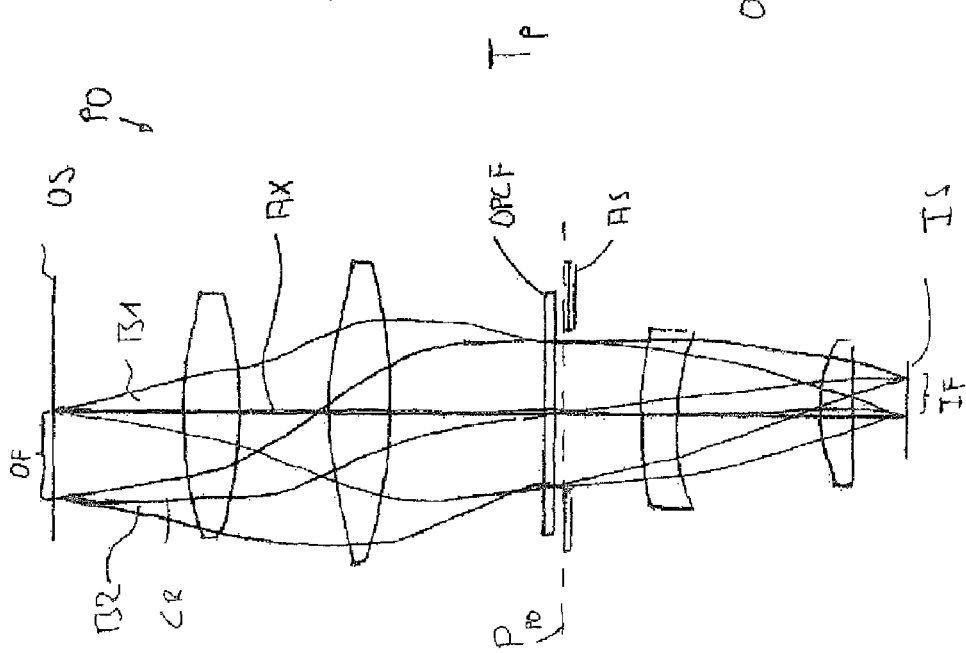
FIG. 3 shows a schematic diagram of the pupil transmission $T_P$ as a function of the normalized pupil coordinates PK of a projection objective without OPC filter (dashed line), and with OPC filter (continuous line), as well as the influence on the transmission of various diffraction orders of a pattern.

FIG. 3 represents the apodization through the so-called "pupil transmission" $T_P$, in the case of which the transmission of the projection objective is plotted as a function of the normalized pupil coordinate PK. The dashed line A represents the typical, substantially rotationally symmetrical profile of the pupil transmission for a refractive projection objective It may be seen that in the vicinity of the optical axis (PK=0) the pupil transmission has a relatively high value which initially still increases with the rising radial distance from the optical axis, before the transmission drastically decreases in the vicinity of the edge of the pupil in the case of yet larger distances from the optical axis.

This strong variation in the effective transmission of the projection objective for different ray trajectories through the projection objective can exert a great influence on the imaging quality. This is explained with the aid of FIG. 3 for a projection exposure process with so-called "oblique illumination". In order to set this illumination mode, an appropriate setting of the optical components of the pupil shaping unit PF is used to set in the illuminating system ILL a dipole illumination which is characterized by two illumination level maxima M1 and M2 of the illumination pupil (FIG. 1) that lie diametrically opposite the optical axis and completely outside the optical axis. The pattern PAT as a diffraction grating for the illuminating radiation thus produced, the diffraction angles of the region II with a relatively large grating constant (relatively large pitch or relatively small line density) being less than those of region I with a relatively large line density (relatively small pitch). The 0th diffraction order "0" lies outside the optical axis in accordance with the off-axis position of the illumination maxima in the pupil surface $P_{ILL}$ of the illuminating system, at a normalized pupil coordinate of approximately −0.75 in the case of the example. The off-axis position of the illumination level maximum is selected in this case such that the first diffraction order $1^{II}$ belonging to region II with a relatively low line density lies in substantially symmetrical fashion to the optical axis on the opposite side of the pupil at a pupil coordinate of PK=+0.75. The higher line density of region I leads to relatively large diffraction angles such that the associated first diffraction order $1_I$ at the outermost edge of the pupil lies at a pupil coordinate of PK of approximately 0.95. This edge position of the first diffraction order shows that for the selected numerical aperture of the projection objective the relatively high line density of region I lies near the limit of resolution of the projection objective.

The different diffraction orders are now transmitted with the local pupil transmission corresponding to their position in the pupil such that different, pattern-specific values for the exposure dose are yielded for the partial patterns. In the case of the projection objective, represented by curve A, without pupil filtering, the relatively coarse structures of region II can be imaged by relatively high dose, since the pupil transmission values belonging to the 0th diffraction order and to the associated first diffraction order $1_{II}$, which values are substantially identical, lie in the vicinity of the maximum value at approximately $T_P$=0.96. The associated pattern-specific dose results essentially from the sum $I_0+I_{II}$ of the intensities, belonging to the diffraction orders, on the exposed substrate. By contrast, the pupil transmission for the first diffraction order $1_I$, lying near the edge of the pupil, of the finer partial pattern is significantly lower, being only at approximately $T_P$=0.9 or therebelow. The pattern-specific dose $(I_0+I_I)$ is therefore much lower than that for the relatively coarse structures In the case of the example, this contributes to the fact that the associated lines in the exposed substrate have a line width $LW_I'$ which is much larger (or smaller) than the line width of the lines of region II which lie further apart. The differences in dose described here therefore yield a significant variation in the critical line widths (CD variation) in the exposed substrate, and therefore do not yield optimum imaging. The variation ΔLW' is given in this application by the difference between the largest line width $LW'_{MAX}$ and the smallest line width LW'$_{MIN}$ of the lines produced, normalized to the desired line width LW', that is to say: ΔLW'=(LW'$_{MAX}$−LW'$_{MIN}$)/LW'. Other definitions are also possible. It is typical to prescribe for each lithography process how far the values of the critical line widths (CD values) may fluctuate about a target value.

A strong CD variation is prevented, or at least diminished, in the case of the embodiment of the invention explained here by using an OPC filter OPCF (FIG. 1 and FIG. 2) introduced in the vicinity of the pupil surface of the projection objective to adapt the profile of the pupil transmission function (FIG. 3) to the pattern, characterized by the position of the diffraction orders, of the mask such that for all structural regions coming into question the pupil transmissions of the associated diffraction orders are set in optimized fashion relative to one another such that the CD variation is significantly diminished by comparison with a system without OPC filter. In the case of the example of FIG. 3, spatially resolving transmission filtering in the vicinity of the pupil surface P$_{PO}$ when taking account of the position of the diffraction orders of the pattern influences the pupil transmission function curve T$_P$ such that the variation in the imaged line widths is substantially smaller over all the partial patterns contributing to the imaging than in the case of the same system without OPC filter. After introduction of the OPC filter into the beam path near the or in the pupil surface P$_{PO}$, the 0th diffraction order and the first diffraction order 1$_{II}$ of the more coarsely structured region II continue to have essentially the same transmission. However, the transmission belonging to the first diffraction order 1$_I$ of the more densely structured region I is also now of a comparable order of magnitude owing to the substantial reduction in the edge drop-off of the transmission. The pupil transmission values belonging to the individual diffraction orders are optimized in each case such that there are yielded during imaging for the individual partial patterns of the same line width but different line density different dose values which are adapted to the line density such that despite different line densities in conjunction with the same line width of the lines inside the partial patterns, the corresponding line widths in the exposed substrate are also respectively substantially the same. This reduces the variation in the imaged line widths. It is thereby possible to achieve that during the imaging process the lines present at a relatively high line density maintain substantially the same line width on the substrate as the lines of the more coarsely structured region II which lie further apart from one another.

Figure 4:
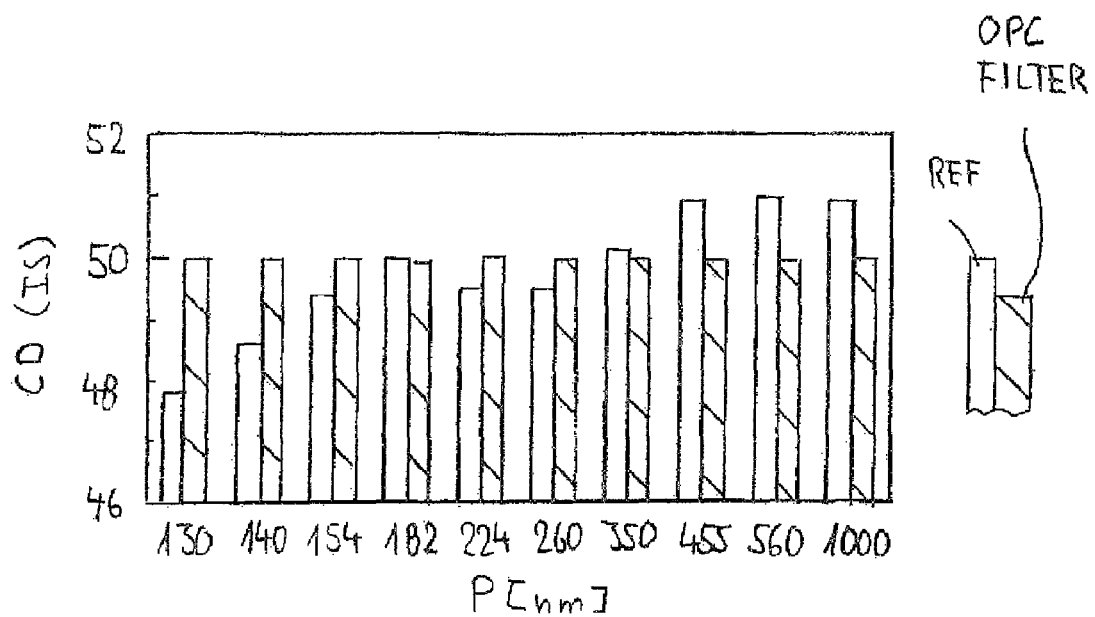
FIG. 4 shows a diagram of the dependence of the critical dimensions CD of lines of a prescribed pattern in the image plane of the projection objective as a function of the pitch P of the lines on the mask for a reference system REF without OPC filter, and for a projection objective with OPC filter.
Figure 5:
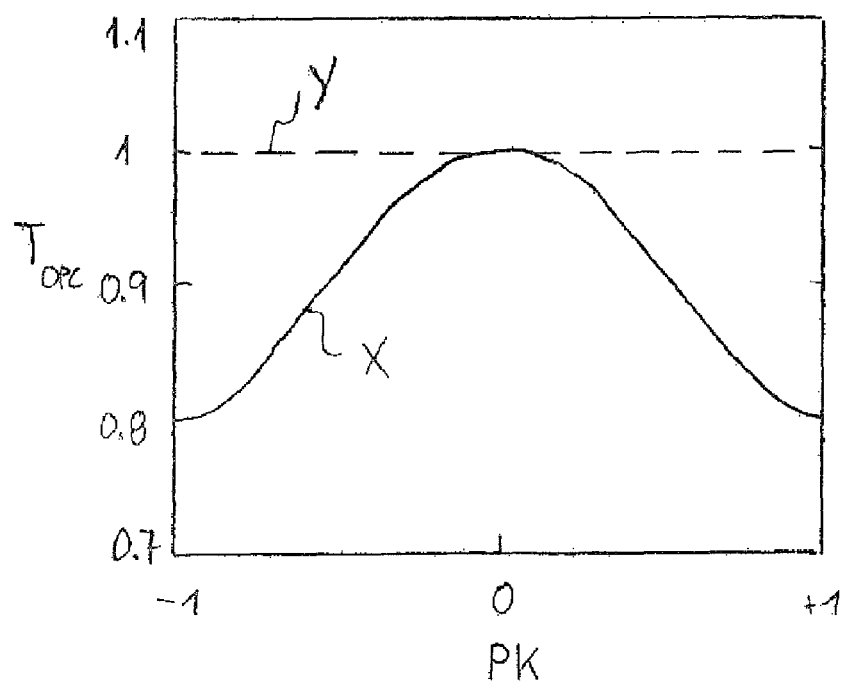
FIG. 5 shows a diagram of an OPC filter function that effects the reduction of the line width variations dependent on line density that is illustrated in FIG. 4.

FIGS. 4 and 5 illustrate a further example of spatially dependent transmission filtering in the region of the pupil surface on the projection objective in order to attain an optical proximity correction. Use was made in this exemplary embodiment of a mask which was optimized with the aid of a commercial programme for OPC optimization of masks for a projection system with the aid of which a target line width of 50 nm should respectively be achieved on the exposed substrate for mask regions of different line densities owing to immersion lithography with an image-side numerical aperture NA=1.2 and annular illumination in the pupil shaping surface. The mask had ten regions with a different line density in each case, as represented by the parameter P[nm] which describes the grating constant of the line gratings or the pitch. The mask included regions with grating constants from 130 nm to 1000 nm. The commercial OPC programme was used to calculate a so-called "mask bias" for each of the different line densities. The term "mask bias" describes here the known, deliberate "detuning" of the line widths of a mask in order to set a desired critical line width CD (or LW') on the exposed substrate. The calculated values of the mask bias MB [nm] are given in Table 1 for the different line densities (represented by pitch or grating constant P [nm]).

TABLE 1

| | P [nm] | | | | | | | | | |
|---|---|---|---|---|---|---|---|---|---|---|
| | 130 | 140 | 154 | 182 | 224 | 260 | 350 | 455 | 560 | 1000 |
| MB [nm] | 8.19 | 11.07 | 13.55 | 14.22 | 19.17 | 19.28 | 12.96 | 10.12 | 10.68 | 10.59 |

It follows that in the regions of different line densities a mask produced on the basis of this calculation will likewise include different line widths in accordance with the calculated mask bias values in order to obtain the same target line width (target CD) of 50 nm for all line densities in the structured substrate during the imaging process for which the calculation was carried out.

The mask optimized for the external system serving as reference system REF was subsequently used to calculate an OPC filter for the exemplary embodiment. Here, the imaging of this mask was calculated with the aid of a projection objective of the exemplary embodiment, and the line widths CD(IS) resulting on the exposed substrate were determined. The bars, respectively shown on the left in the diagram of FIG. 4, of the reference system REF show the resulting line widths of this projection process. It is to be seen therefrom that, in the case of the projection system of the exemplary embodiment, the mask optimized for another projection system does not lead to the targeted line width which is substantially dependent on the line density, but that the line widths attained on the substrate are dependent on the line density and deviate strongly in part (by up to approximately 4%) from the desired target line width (50 nm). The deviations are particularly significant in the case of the finest patterns (pitch≦140 nm) and of the coarsest patterns (pitch≧455 nm), the finer patterns yielding excessively low line widths, and the coarser patterns yielding excessively high line widths. Overall, there is no general rule from which it is possible to derive whether a pattern with a relatively large or relatively small grating constant has the greater critical dimensions.

The CD values are determined by the design of the pattern to be imaged. The mask bias and the illumination settings are optimized in accordance with these stipulations.

The transmission profile shown diagrammatically in FIG. 5 for a grey filter to be placed in the region of the pupil surface P$_{PO}$ of the projection objective was calculated in order to correct the residual error in the order of magnitude of up to approximately 2.5 nm. This transmission filter is adapted to a pattern in the case of which all the lines are aligned in a mutually parallel fashion in a y-direction running perpendicular to the optical axis of the projection system. The filter has a maximum transmission (T$_{OPC}$=1) in its central region (at PK=0) to be placed on the optical axis. The transmission of the transmission filter is constant over all the pupil coordinates at T$_{OPC}$=1 (dashed line) in the y-direction, to be aligned parallel to the y-direction of the mask, of the transmission filter. By contrast, a transmission varying over the cross section (continuous line) is present in the x-direction to be aligned perpendicular to the lines to be imaged. In this x-direction, the transmission decreases continuously towards the edges of the filter in the fashion of a bell curve function, doing so by up to 20% to $T_{OPC}$=0.8. Upon introduction of this OPC filter or this filter function into the region of the pupil surface of the projection objective, it is possible also to use the mask optimized for the reference system with the projection objective of the exemplary embodiment such that, for all line densities located thereon, the desired target value of 50 nm is yielded in each case for the line widths LW' on the substrate (line width variation ΔLW'=0, see hatched bars in FIG. 4).

Thus, in this example, a line width error of approximately 2.5 nm can be corrected by varying the pupil transmission by approximately 20% in a direction perpendicular to the lines to be imaged. It can be estimated therefrom that the residual errors can be corrected to values of less than 0.5 nm given an accuracy of approximately 2% in the selected line width region for the transmission profile of a filter element.

As a rule, the critical line width on the exposed substrate or in the image plane becomes more difficult to control the smaller the targeted line widths. Given a suitable design, the methods described here can be used with acceptable outlay to attain line width variations lying in the region of less than 3% or less than 2% of the grating constants P of the partial patterns of the mask. The OPC filter functions can be set such that, given absolute grating constants P of periodic partial patterns of the mask, a variation ΔLW' in the line width in the image surface of the projection objective for all grating constants P occurring in the pattern, that is to say for all partial patterns of different line density, is smaller than a prescribable limit value L(ΔLW'), or corresponds to this limit value. In particular, the condition L(ΔLW')≦P·0.05 can be satisfied, it being possible for the ratio ΔLW'/P also to be substantially smaller than 3%, and, for example, amount to 2.5%, 2% or less.

Figure 6:
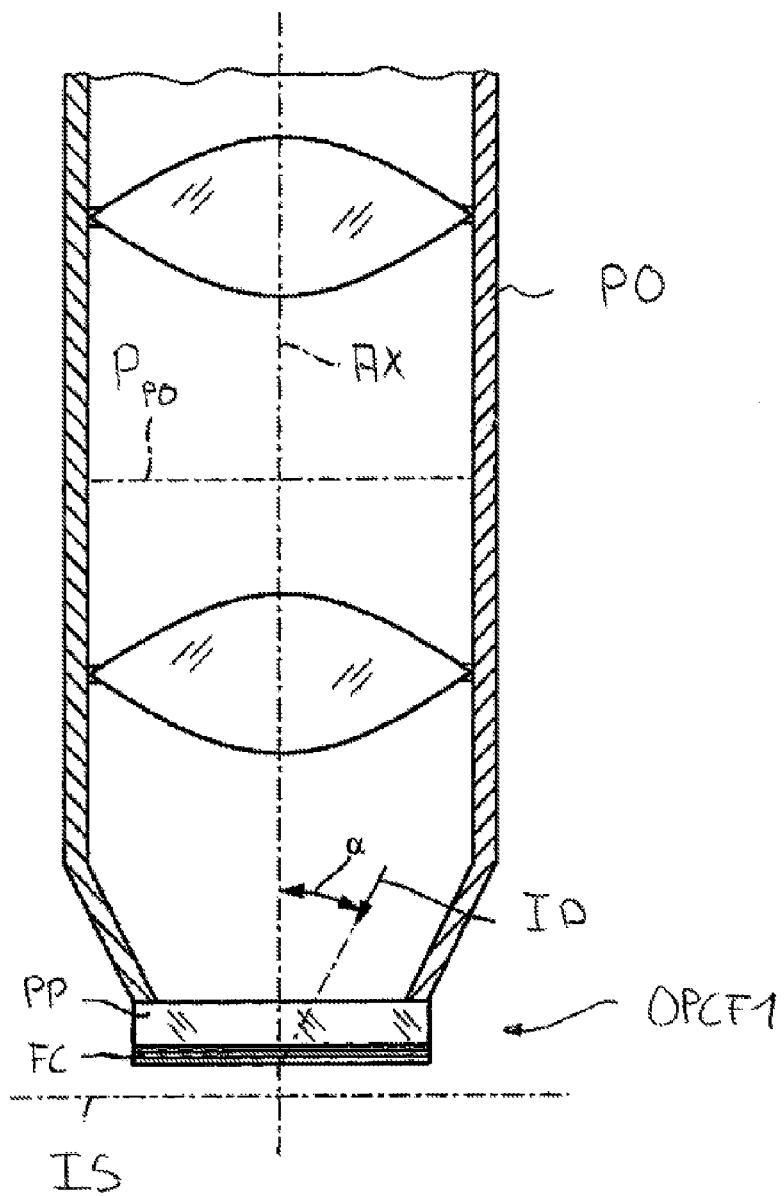
FIG. 6 shows schematically an image-side end portion of a projection objective having an angle-selective OPC transmission filter arranged close to the image surface of the projection objective.

FIG. 6 shows schematically an image-side end portion of a projection objective PO having an angle-selective OPC transmission filter OPCF1 arranged close to the image surface IS of the projection objective. The OPC filter is arranged in the region of a field surface (i.e. the image surface) of the projection objective that is Fourier-transformed to the pupil surface $P_{PO}$ of the projection objective. The angle-selective transmission filter comprises a transparent plane plate PP and an angle-selective filter coating FC applied to the planar plate surface facing the image surface of the projection objective. The term "angle-selective transmission filter" denotes an optical transmission filter having a filter function which varies in a predefined manner as a function of the angle of incidence of the radiation incident on the filter. In general, the angle of incidence α of a ray incident on a surface is the angle between the incidence direction and the surface normal at the point of incidence. In the example of FIG. 6, the plane of the filter coating is perpendicular to the optical axis AX of the projection objective. Therefore the angle of incidence corresponds to the angle between the incidence direction ID and the optical axis AX of the projection objective. The transmittance T of the filter is set as a function of the angle of incidence, alpha, according to T=f(α). The angle-selective filter function is set such that it corresponds to a specific spatially dependent transmission filtering in the region of the pupil surface. The filter function T=f(α) may thereby correspond, for example, to the spatially dependent filter function represented by continuous line B in FIG. 3.

The wording of all the claims is incorporated in the description by reference.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. Method for correcting optical proximity effects when imaging a pattern, arranged in an object surface of a projection objective, into an image surface of the projection objective, wherein a multiplicity of optical elements and at least one pupil surface that is Fourier-transformed to the image surface are arranged between the object surface and the image surface, comprising:
   optical filtering of imaging light with at least one optical proximity correction (OPC) filter inserted between the object surface and the image surface in accordance with an OPC-filter function that is adapted to the pattern and corresponds to a spatially dependent transmission filtering in a region of the pupil surface, and
   selecting the OPC-filter function for the projection objective in accordance with a position of diffraction orders caused by the pattern such that variations in line widths in the image surface that are generated by interference of the diffraction orders are weaker than corresponding variations for the projection objective without the optical filtering.

2. Method according to claim 1, wherein the optical filtering in which the transmission varies as a function of a pupil spatial coordinate is carried out in the region of the pupil surface.

3. Method according to claim 2, wherein, during an exposure, a first partial pattern having a first line density is imaged with a first dose, while simultaneously a second partial pattern, having a second line density that deviates from the first line density, is imaged with a second dose that differs from the first dose.

4. Method according to claim 3, wherein the second partial pattern lies with a lateral offset next to the first partial pattern.

5. Method according to claim 2, wherein the optical filtering in the region of the pupil surface is performed according to a non-rotational symmetric transmission function.

6. Method according to claim 5, wherein the transmission function has a two-fold radial symmetry with respect to an optical axis of the projection objective.

7. Method according to claim 2, wherein the optical filtering in the region of the pupil surface is performed with a plurality of at least three different transmission values in a filter effective area.

8. Method according to claim 2, wherein the transmission varies continuously in at least a partial area of the transmission filter.

9. Method according to claim 1, wherein the OPC-filter function is set such that for different grating constants P of periodic partial patterns of the mask a variation ΔLW' in the line widths in the image surface of the projection objective is smaller for all the grating constants occurring in the pattern than a prescribed limit value L(ΔLW'), or corresponds to the prescribed limit value such that the condition L(ΔLW')≦P·0.05 is satisfied.

10. Method according to claim 1, wherein a transmission filter is used in the region of the pupil surface, where the transmission filter is adapted to a pattern in which lines are parallel to one another in a first direction running perpendicular to the optical axis of the projection objective, wherein the transmission filter has a transmission that is maximum in a central region placed on the optical axis, the transmission of the transmission filter is substantially constant over all pupil coordinates in a first direction of the transmission filter aligned parallel to the first direction of the pattern, and a transmission varying over the cross section of the transmission filter is present in a second direction aligned perpendicular to the lines to be imaged.

11. Method according to claim 10, wherein in the second direction the transmission decreases continuously from the central region to the edges of the filter.

12. Method according to claim 1, wherein the optical filtering is carried out by angle-selective filtering in the region of a field surface of the projection objective that is Fourier-transformed to the pupil surface.

13. Projection objective for imaging a pattern arranged in an object surface of the projection objective into an image surface of the projection objective, comprising:
   a multiplicity of optical elements and at least one pupil surface that is Fourier-transformed to the image surface, arranged between the object surface and the image surface, and
   at least one optical proximity correction (OPC) filter optically filtering light used for the imaging in accordance with an OPC-filter function that is adapted to the pattern and corresponds to a spatially dependent transmission filtering in a region of the pupil surface and correcting optical proximity effects during imaging of the pattern onto the image surface,
   wherein the OPC-filter function is selected in accordance with a position of diffraction orders caused by the pattern such that variations in line widths in the image surface that are generated by interference of the diffraction orders are weaker than corresponding variations for the projection objective without the optical filtering.

14. Projection objective according to claim 13, wherein the OPC filter, in which the transmission varies as a function of pupil spatial coordinates, is arranged in the region of the pupil surface.

15. Projection objective according to claim 14, wherein the OPC filter has a non-rotational symmetric transmission function.

16. Projection objective according to claim 15, wherein the transmission function has a two-fold radial symmetry with respect to an optical axis of the projection objective.

17. Projection objective according to claim 14, wherein the OPC filter has a plurality of at least three different transmission values in a filter effective area.

18. Projection objective according to claim 14, wherein the transmission varies continuously in at least a partial area of the transmission filter.

19. Projection objective according to claim 13, wherein the OPC-filter function is selected such that for different grating constants P of periodic partial patterns of the mask a variation $\Delta LW'$ in the line widths in the image surface of the projection objective is smaller for all the grating constants occurring in the pattern than a prescribed limit value $L(\Delta LW')$, or corresponds to the prescribed limit value such that the condition $L(\Delta LW') \leq P \cdot 0.05$ is satisfied.

20. Projection objective according to claim 13, wherein an angle-selective optical proximity correction (OPC) filter in which the transmission varies as a function of an angle of incidence of incident radiation is arranged in the region of a field surface of the projection objective that is Fourier-transformed to the pupil surface.

21. Method for producing an optical filter for carrying out an optical filtering in accordance with a filter function, comprising:
   defining a pattern that has a first partial pattern with a first line density, and at least a second partial pattern with a second line density that differs from the first line density;
   calculating an imaging of the pattern, arranged in an object surface of a projection objective, into an image surface of the projection objective, wherein a multiplicity of optical elements and at least one pupil surface that is Fourier-transformed to the image surface are arranged between the object surface and the image surface;
   defining a filter function for optically filtering light used for the imaging, the filter function corresponding to a spatially dependent transmission filtering in a region of the pupil surface of the projection objective;
   determining a variation in line widths in the image surface of the projection objective that are generated by interference of diffraction orders of the pattern;
   optimizing the filter function by stepwise variation in the filter function and repeated determination of the variation in the line width in order to determine an optimized filter function in which the variation in the line widths that are generated lies below a prescribed limit value; and
   producing the optical filter in accordance with the optimized filter function.

22. Method according to claim 21, wherein the optimized filter function is defined such that for different grating constants P of periodic partial patterns of the mask a variation $\Delta LW'$ in the line widths in the image surface of the projection objective is smaller for all the grating constants occurring in the pattern than a prescribed limit value $L(\Delta LW')$, or corresponds to the prescribed limit value such that the condition $L(\Delta LW') \leq P \cdot 0.05$ is satisfied.

23. Method according to claim 21, wherein the filter function varies in accordance with an angle of incidence on the optical filter of the light used for the imaging, to carry out the optical filtering in a region of a field surface of the projection objective that is Fourier-transformed to the pupil surface of the projection objective.

24. Optical filter configured for a projection objective for imaging a pattern, arranged in an object surface of the projection objective, into an image surface of the projection objective, wherein a multiplicity of optical elements and at least one pupil surface that is Fourier-transformed to the image surface are arranged between the object surface and the image surface,
   wherein the filter is an OPC filter for optically filtering light used for the imaging in accordance with an optical proximity correction (OPC) filter function that is adapted to the pattern and corresponds to a spatially dependent transmission filtering in a region of the pupil surface and is adapted to correct optical proximity effects during imaging of the pattern into the image surface, and wherein the OPC-filter function is selected in accordance with a position of diffraction orders caused by the pattern such that a variation in line widths in the image surface that is generated by interference of the diffraction orders is weaker than a corresponding variation for the projection objective without the optical filtering.

25. Optical filter according to claim 24, configured as a transmission filter for installation in the region of the pupil surface and having a transmission varying as a function of the pupil spatial coordinate.

26. Optical filter according to claim 25, having a non-rotational symmetric transmission function.

27. Projection objective comprising an optical filter according to claim 26, wherein the transmission function has a two-fold radial symmetry with respect to an optical axis.

28. Optical filter according to claim 25, having a plurality of at least three different transmission values in a filter effective area.

29. Projection objective comprising an optical filter according to claim 25, wherein the transmission varies continuously in at least a partial area of the transmission filter.

30. Optical filter according to claim 25, wherein the transmission filter is adapted to a pattern in which lines are aligned parallel to one another in a first direction running perpendicular to the optical axis of the projection system,
wherein the transmission filter has a transmission that is maximum in a central region placed on the optical axis, the transmission of the transmission filter is substantially constant over all pupil coordinates in a first direction of the transmission filter aligned parallel to the first direction of the pattern, and a transmission varying over the cross section of the transmission filter is present in a second direction aligned perpendicular to the lines to be imaged.

31. Optical filter according to claim 30, wherein in the second direction the transmission decreases continuously from the central region to the edges of the filter.

32. Optical filter according to claim 24, wherein the filter function varies in accordance with an angle of incidence on the optical filter of the light used for the imaging, and wherein the angle-variant filtering is in a region of a field surface of the projection objective that is Fourier-transformed to the pupil surface of the projection objective.

33. Method for imaging a pattern, arranged in an object surface of a projection objective, to an image surface of the projection objective, wherein a multiplicity of optical elements and at least one pupil surface that is Fourier-transformed to the image surface are arranged between the object surface and the image surface,
wherein the projection objective is adjusted, for imaging the pattern, by optical filtering of imaging light using at least one optical proximity correction (OPC) filter inserted between the object surface and the image surface according to an OPC-filter function adapted to the pattern such that the pattern is imaged with the projection objective including the OPC filter into the image surface.

34. Method according to claim 33, wherein a transmission filtering with spatially varying transmission is performed in the region of the pupil surface by the OPC filter.

35. Method according to claim 34, wherein the OPC filter has a non-rotational symmetric transmission function.

36. Method according to claim 35, wherein the transmission function of the transmission filter has a two-fold radial symmetry in respect to an optical axis of the projection objective.

37. Method according to claim 33, wherein the OPC-filter function varies in accordance with an angle of incidence on the OPC filter of the imaging light, and wherein the angle-variant filtering is carried out in a region of a field surface of the projection objective that is Fourier-transformed to the pupil surface of the projection objective.

* * * * *

UNITED STATES PATENT AND TRADEMARK OFFICE
CERTIFICATE OF CORRECTION

PATENT NO. : 8,027,091 B2
APPLICATION NO. : 11/750547
DATED : September 27, 2011
INVENTOR(S) : Paul Graeupner It is certified that error appears in the above-identified patent and that said Letters Patent is hereby corrected as shown below:

Title Page 2, Item (56), under "OTHER PUBLICATIONS", Line 3: delete "Mar. 2000," and insert -- Mar. 1, 2000, --
Column 1, Line 60: delete "(optical" and insert -- (Optical --
Column 3, Line 6: delete "(optical" and insert -- (Optical --
Column 5, Line 65: delete "coordinate in" and insert -- coordinate. In --
Column 8, Line 22: delete "w" and insert -- W --
Column 9, Line 30: delete "IP" and insert -- IF --
Column 10, Lines 1-2: delete "objective It" and insert -- objective. It --
Column 10, Line 30: delete "order $1^{II}$" and insert -- order $1_{II}$ --
Column 10, Lines 58-59: delete "structures In" and insert -- structures. In --
Column 13, Line 37: Below "less." insert, as a new paragraph -- The exemplary embodiment shows that with the aid of OPC filtering it is possible with comparatively low outlay on apparatus to use a mask which has been optimized for imaging by means of a specific projection process for other projection processes, as well, if appropriate also for projection with the aid of other projection objectives, without the need for recalculation and renewed production of the mask. The invention thus enables a possibility, associated with acceptable outlay, for the fine control of the imaging of different structures by fine control of the pupil transmission of a projection objective. By adapting the pupil transmission to the structures to be imaged while taking account of the imaging properties of the projection objective, it is thereby possible to achieve a reliable control of the CD uniformity of the different structures. --

Signed and Sealed this
Fourth Day of December, 2012

David J. Kappos
*Director of the United States Patent and Trademark Office*